(12) United States Patent
Choi et al.

(10) Patent No.: US 7,786,573 B2
(45) Date of Patent: Aug. 31, 2010

(54) PACKAGING CHIP HAVING INTERCONNECTION ELECTRODES DIRECTLY CONNECTED TO PLURAL WAFERS

(75) Inventors: Min-seog Choi, Seoul (KR); Kae-dong Back, Yongin-si (KR); In-sang Song, Seoul (KR); Woon-bae Kim, Suwon-si (KR); Byung-gil Jeong, Anyang-si (KR); Kyu-dong Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 195 days.

(21) Appl. No.: 11/481,012

(22) Filed: Jul. 6, 2006

(65) Prior Publication Data
US 2007/0013058 A1    Jan. 18, 2007

(30) Foreign Application Priority Data
Jul. 15, 2005    (KR) .................... 10-2005-0064169

(51) Int. Cl.
*H01L 23/34* (2006.01)
*H01R 12/16* (2006.01)
*H05K 1/11* (2006.01)

(52) U.S. Cl. .............. 257/724; 257/774; 257/777; 361/790; 361/792; 174/255; 174/262

(58) Field of Classification Search .......... None
See application file for complete search history.

(56) References Cited

U.S. PATENT DOCUMENTS

| 4,954,875 | A  | * | 9/1990  | Clements     | 257/686 |
| 5,748,452 | A  | * | 5/1998  | Londa        | 361/790 |
| 6,297,548 | B1 | * | 10/2001 | Moden et al. | 257/686 |
| 6,888,253 | B1 | * | 5/2005  | Rogers et al.| 257/774 |

FOREIGN PATENT DOCUMENTS

| KR | 2001-0073345 A | 8/2001 |
| KR | 2003-0046791 A | 6/2003 |

* cited by examiner

*Primary Examiner*—Alonzo Chambliss
(74) *Attorney, Agent, or Firm*—Sughrue Mion, PLLC

(57) ABSTRACT

A packaging chip formed with plural wafers. The packaging chip includes plural wafers stacked in order and plural interconnection electrodes directly connecting the plural wafers from an upper surface of an uppermost wafer of the plural wafers to the other wafers. At least one or more of the plural wafers mounts a predetermined circuit device thereon. Further, at least one or more wafers of the plural wafers have a cavity of a predetermined size. Meanwhile, the packaging chip further includes plural pads independently arranged on the upper surface of the uppermost wafer one another and electrically connected to the plural interconnection electrodes respectively. Accordingly, the present invention can enhance the performance and reliability of a packaging chip and improve fabrication yield.

6 Claims, 4 Drawing Sheets

PACKAGING CHIP HAVING INTERCONNECTION ELECTRODES DIRECTLY CONNECTED TO PLURAL WAFERS

CROSS-REFERENCE TO RELATED APPLICATIONS

This application claims benefit under 35 U.S.C. §119 from Korean Patent Application No. 2005-64169 filed on Jul. 15, 2005, the entire contents of which are incorporated herein by reference.

BACKGROUND OF THE INVENTION

1. Field of the Invention

The present invention relates to a packaging chip formed in a multi-layer structure of stacking plural wafers in serial order and a fabrication method therefor and, more particularly, to a packaging chip having interconnection electrodes directly connecting each wafer from a uppermost wafer and a fabrication method therefor.

2. Description of the Related Art

The electronic chip diversely used in various electronic products can be easily damaged by external shocks since the electronic chip has a minute electronic circuit therein. Thus, a packaging process is inevitably required in chip fabrication processes.

The packaging process refers to a task of forming a physical function and a shape in order for a circuit device to be mounted. That is, the packaging process refers to a task of hermetically sealing a circuit device in order to prevent introduction of foreign material into the circuit device or prevent the circuit device from being damaged by external shocks. For hermetical sealing of the circuit device, a separate substrate is used for a packaging substrate to be formed, and the packaging substrate is bonded to a base substrate in which the circuit device is mounted. As above, a packaging-processed chip is generally referred to as a packaging chip.

In particular, the wafer level packaging is processed to meet the trend of recent electronic products such as compactness, high-performance, and so on. Further, for high-performance, plural wafers are stacked in a multi-layer structure so that circuit devices of diverse kinds can be mounted in the individual layers. In here, each wafer plays a role of packaging a circuit device mounted on a wafer located below itself. The packaging chip structured as above is generally referred to as a 3D packaging chip. Meanwhile, since the 3D-structured packaging chip uses plural wafers, plural interconnection electrodes are needed. Each interconnection electrode supplies external electric power to circuit wirings on each wafer stacked in serial order.

Conventionally, for the formation of the 3D-structured packaging chip, an interconnection electrode is formed to connect lower and upper wafers every time a wafer is stacked. That is, the second wafer is bonded over the first base wafer, and an interconnection electrode is formed to pass through the second wafer so that the upper surface of the second wafer is electrically connected to the base wafer. Next, the third wafer is bonded, and an interconnection electrode is formed to pass through the third wafer. Here, for connections to the base wafer, a structure is required which connects the interconnection electrode on the second wafer and the interconnection electrode on the third wafer. In general, ball bumps are used to connect the interconnection electrodes one another.

However, such a conventional packaging chip fabrication process requires a via-forming process for forming interconnection electrodes every time each wafer is stacked. Thus, the via-forming process is performed several times, during which the wafers can be damaged. As a result, there exists a problem of deteriorating fabrication yield.

Further, in the conventional packaging chip, an interconnection electrode is separately formed on each wafer and connected by means of the ball bump or the like. That is, the interconnection electrode is not directly connected to each wafer, but connected indirectly by means of the ball bump or the other interconnection electrode. Thus, the thermal expansion or contraction of the interconnection electrode can break the electrical connections of the interconnection electrode to the ball bump. Accordingly, there exists a problem of degrading reliability and performance of a packaging chip.

Further, a signal can be leaked out due to a high-resistance value of the ball bump connecting each interconnection electrode. Thus, there exists a problem of degrading the entire performance of the packaging chip.

Further, in a process of arranging and bonding each wafer in order, the arrangement mismatch can occur due to the ball bumps. That is, if plural ball bumps are formed on one wafer, the wafers may not be precisely arranged in order due to height differences, areas, and so on. If a multi-layer structure is formed in such circumstances, there can occur a problem of degrading the performance of the packaging chip due to accumulation of the arrangement errors.

SUMMARY OF THE INVENTION

One aspect of the present invention is to solve the above drawbacks and other problems associated with the conventional arrangement. Another aspect of the present invention is to provide a packaging chip and a fabrication method therefor capable of enhancing performance, reliability, and yield by using interconnection electrodes directly connected to each wafer.

The foregoing and other aspects and advantages are substantially realized by providing a packaging chip, comprising plural wafers stacked in order; and plural interconnection electrodes directly connecting the plural wafers from an upper surface of an uppermost wafer of the plural wafers to the other wafers.

At least one or more wafers of the plural wafers have a cavity of a predetermined size.

Further, at least one or more of the plural wafers mounts a predetermined circuit device thereon, respectively.

The packaging chip may further comprises plural pads independently arranged on the upper surface of the uppermost wafer one another and electrically connected to the plural interconnection electrodes respectively.

Meantime, the foregoing and other aspects and advantages are substantially realized by providing a packaging chip fabrication method, comprising steps of (a) bonding plural wafers in order; (b) forming plural via holes connecting the plural wafers from an upper surface of a uppermost wafer of the plural wafers to the other wafers; and (c) coating the insides of the plural via holes in order, and forming plural interconnection electrodes directly connected from the upper surface of the uppermost wafer to the other wafers.

The step (a) includes depositing metal layers on the upper surfaces of the other wafers.

The step (b) includes using as an etching stop layer a metal layer formed on each of the upper surface of the other wafers, etching the plural wafers, and forming the plural via holes.

Further, at least one or more wafers of the plural wafers has a cavity of a predetermined size, respectively.

Further, at least one or more wafers of the plural wafers mount a predetermined circuit device thereon, respectively.

Meantime, the packaging chip fabrication method further comprises a step of forming plural pads independently arranging on the upper surface of the uppermost wafer one another and electrically connected to the plural interconnection electrodes, respectively.

In here, the step (c) includes performing a damascene coating process using the plural pads to coat the insides of the plural via holes in order.

Further, the step (a) includes arranging and bonding plural wafers each having a different diameter in a coaxial line in order of diameter size so that a predetermined area of each of the plural wafers are externally exposed.

In here, the step (c) includes performing a back contact coating process using the externally exposed area of each of the plural wafers and coating the insides of the plural via holes in order.

BRIEF DESCRIPTION OF THE DRAWINGS

The above aspects and features of the present invention will be more apparent by describing certain exemplary embodiments of the present invention with reference to the accompanying drawings, in which.

DETAILED DESCRIPTION OF ILLUSTRATIVE, NON-LIMITING EMBODIMENTS OF THE INVENTION

Hereinafter, exemplary embodiments of the present invention will be described in detail with reference to the accompanying drawings. The described exemplary embodiments are intended to assist the understanding of the invention, and are not intended to limit the scope of the invention in any way.

Figure 1:
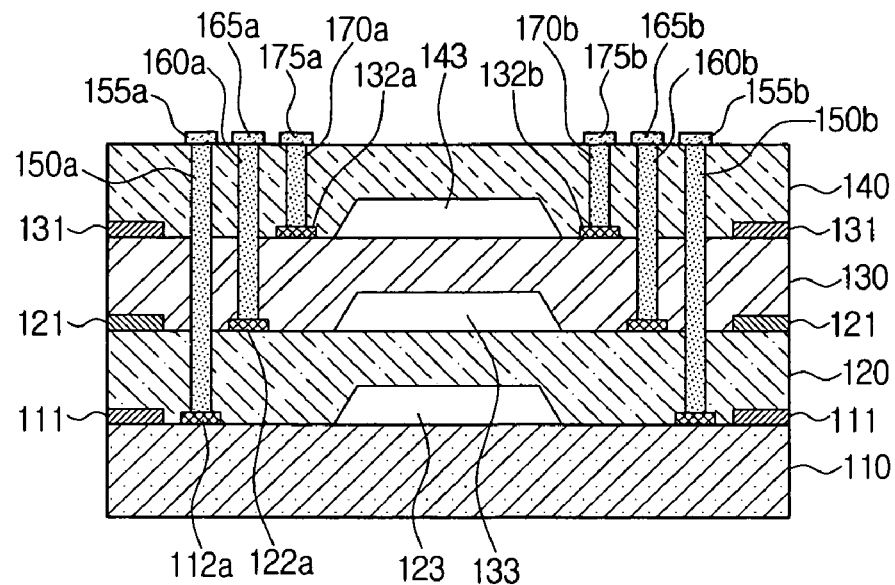
FIG. 1 is a vertical cross-sectional view for showing a structure of a packaging chip according to an exemplary embodiment of the present invention.

FIG. 1 is a vertical cross-sectional view for showing a structure of a packaging chip according to an exemplary embodiment of the present invention. In FIG. 1, the packaging chip has a structure in which plural wafers 110, 120, 130 and 140 are stacked in order. In this disclosure, the individual wafers are referred to as first to fourth wafers 110 to 140 in the stacked order.

The first metal layers 112a and 112b and the first sealing layer 111 are stacked over the first wafer 110. The first sealing layer 111 is a portion for bonding the second wafer 120 and the first wafer 110. The first metal layers 112a and 112b play a role of electrically connecting the first interconnection electrodes 150a and 150b to a circuit device (not shown) mounted on the first wafer 110.

Second metal layers 122a and 122b and a second sealing layer 121 are stacked on the second wafer 120. The second sealing layer 121 is a portion for bonding the second wafer 120 and the third wafer 130. The second metal layers 122a and 122b play a role of electrically connecting the second interconnection electrodes 160a and 160b and a circuit device (not shown) mounted on the second wafer 120.

Third metal layers 132a and 132b and a third sealing layer 131 are stacked over the third wafer 130. The third sealing layer 131 is a portion for bonding the third wafer 130 to the fourth wafer 140. The third metal layers 132a and 132b play a role of electrically connecting third interconnection electrodes 170a and 170b to a circuit device (not shown) mounted over the third wafer 130.

The fourth wafer 140 corresponds to the uppermost wafer of the whole wafer 110 to 140. Plural pads 155a, 155b, 165a, 165b, 175a, and 175b are formed over the fourth wafer 140. The individual pads 155a, 155b, 165a, 165b, 175a, and 175b are connected to plural interconnection electrodes 150a, 150b, 160a, 160b, 170a, and 170b, respectively.

The individual interconnection electrodes 150a, 150b, 160a, 160b, 170a, and 170b are directly connected from the upper surface of the fourth wafer 140 to the first to third wafers 110 to 130, respectively. In detail, the first interconnection electrodes 150a and 150b are connected to the first metal layers 112a and 112b formed over the upper surface of the first wafer 110, the second interconnection electrodes 160a and 160b are connected to the second metal layers 122a and 122b formed over the upper surface of the second wafer 120, and the third interconnection electrodes 170a and 170b are connected to the third metal layers 132a and 132b formed over the upper surface of the third wafer 130. Since the interconnection electrodes 150a, 150b, 160a, 160b, 170a, and 170b are directly connected to the wafers 110 to 130 without passing through any extra connection structure such as ball bumps, as described above, there can be solved problems of performance degradation due to high-resistance value of the ball bumps, breakage due to the thermal expansion and contraction, and so on.

Meanwhile, a cavity can be formed depending on the design purpose of a packaging chip. If a film bulk acoustic resonator (FBAR) is taken for an example, there may be an air-gap type cavity structure formed for reflections of an acoustic wave. Thus, the wafers 120, 130 and 140 can be provided with the cavities 123, 133 and 143, respectively. If circuit devices are mounted on the surfaces of the first to third wafers 110 to 130 and the wafers 110 to 130 are bonded, it can be implemented for the circuit devices to be located inside the cavities 123 to 143.

Further, the circuit devices can be built in the individual wafers 110 to 140. The individual circuit devices can be connected to the respective metal layers 112a, 112b, 122a, 122b, 132a, and 132b through wirings (not shown) formed over the upper surfaces of the respective wafers 110 to 140.

Further, the packaging chip of FIG. 1 is formed with the total four wafers 110 to 140, but the number of wafers can change depending on the design purpose of the packaging chip. The number of the interconnection electrodes changes as the number of the wafers changes. Meanwhile, in FIG. 1, two interconnection electrodes are implemented to connect to one wafer, but the number of the interconnection electrodes can arbitrarily change as well.

Figure 2A:
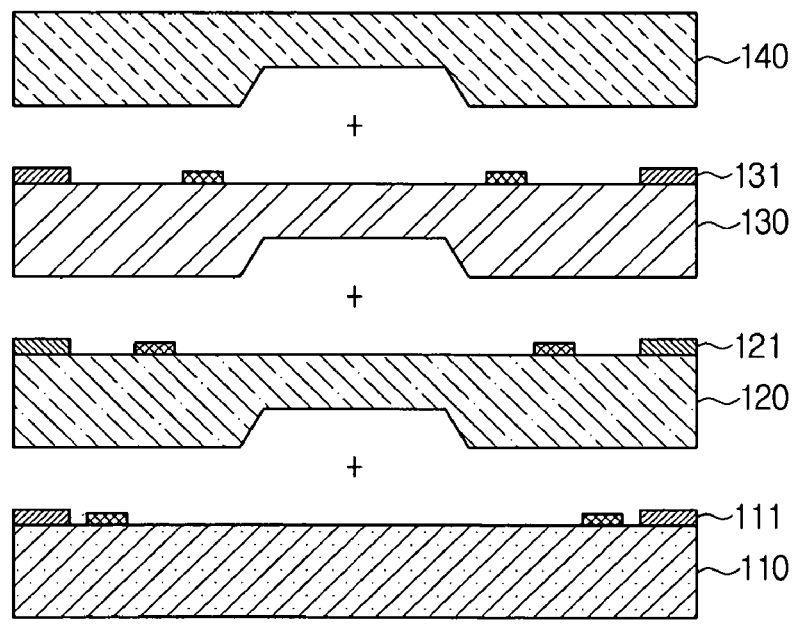
FIG. 2A to FIG. 2E are vertical cross-sectional views for explaining a fabrication method for fabricating the packaging chip of FIG. 1.

FIG. 2A to FIG. 2E are vertical cross-sectional views for explaining a packaging chip fabrication method of FIG. 1. In FIG. 2A, four separate wafers 110 to 140 are provided. Of the wafers 110 to 140, the wafers 110 to 130 except the uppermost wafer 140 have sealing layers 111, 121, and 131 and metal layers 112a, 112b, 122a, and 132a formed thereon. Further, certain areas can be etched away, if necessary, for formation of cavity. In FIG. 2A, certain areas on the lower surfaces of the second to fourth wafers 120 to 140 are etched away. The whole wafers 110 to 140 separated as above are bonded in order by the sealing layers 111, 121, and 131.

Figure 2B:
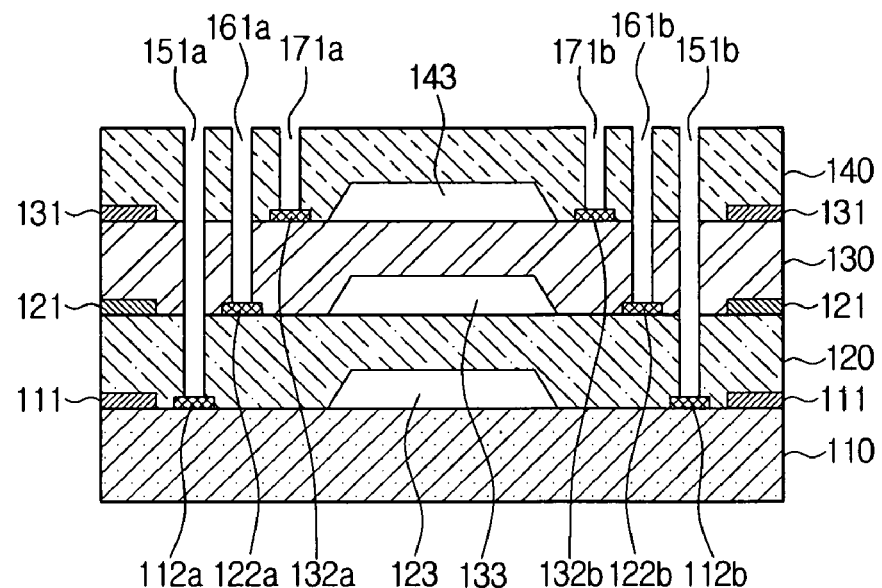

If completely bonded, the via holes 151a, 151b, 161a, 161b, 171a, and 171b are formed to connect the individual wafers 110 to 140 from the uppermost wafer, that is, the upper surface of the wafer 140 as shown in FIG. 2B. The Reactive Ion Etching (RIE) process can be used for formations of the via holes 151a, 151b, 161a, 161b, 171a, 171b. Meanwhile, the metal layers 112a, 112b, 122a, 122b, 132a, and 132b can be used as etching stop layers in the etching process for the via holes 151a, 151b, 161a, 161b, 171a, and 171b. That is, if an etching substance is used which selectively etches away silicon, the etching stops on the metal layers 112a, 112b, 122a, 122b, 132a, and 132b.

Figure 2C:
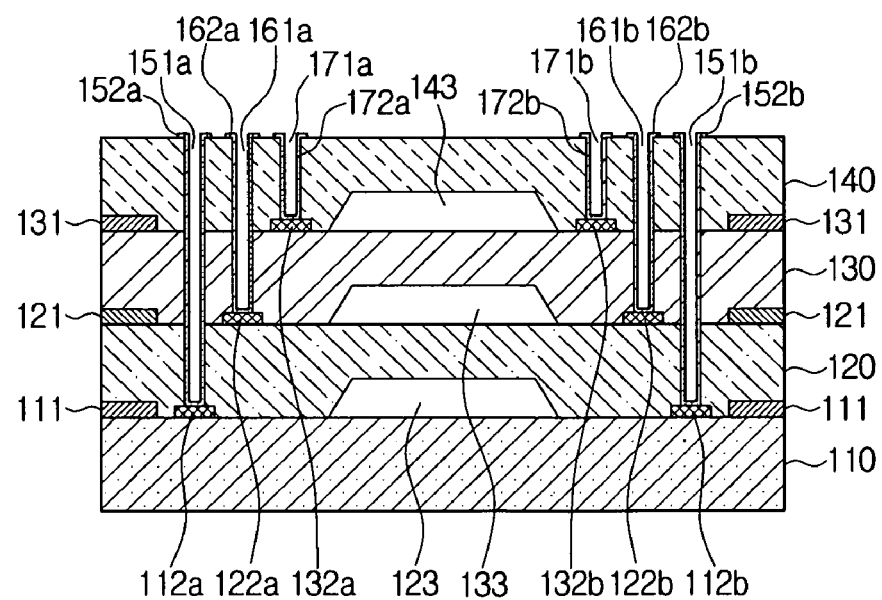

Next, as shown in FIG. 2C, seed layers 152a, 152b, 162a, 162b, 172a, and 172b are formed inside the individual via holes 151a, 151b, 161a, 161b, 171a, and 171b.

Figure 2D:
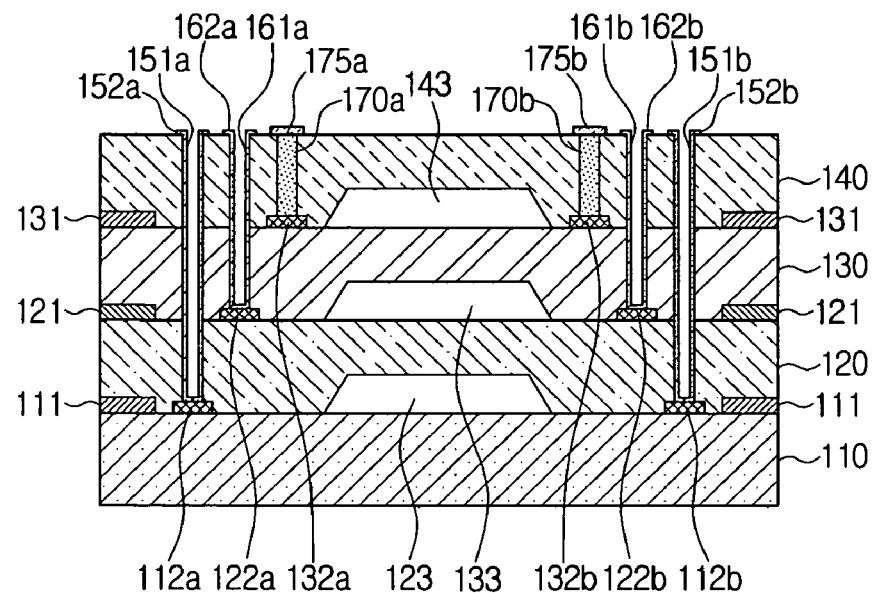
Figure 2E:
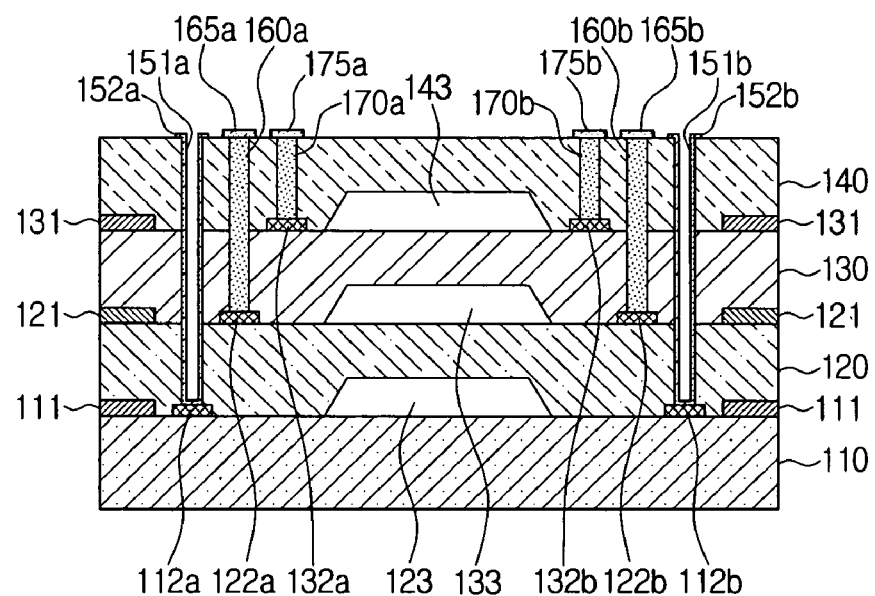

Next, as shown in FIG. 2D and FIG. 2E, the individual via holes 151a, 151b, 161a, 161b, 171a, and 171b are coated in order for formation of the interconnection electrodes 150a, 150b, 160a, 160b, 170a, and 170b. That is, since the via holes 151a, 151b, 161a, 161b, 171a, and 171b have different depths respectively, it is difficult to coat the holes at the same time at the same coating conditions. Thus, the via holes having the same depth are coated at the same time. In FIG. 2D and FIG. 2E, the third via holes 171a and 171b connected on the third wafer 130 are firstly coated, and the second via holes 161a and 161b connected on the second wafer 120 are secondly coated. Finally, if the first via holes 151a and 151b connected on the first wafer 110 are coated, the packaging chip structured in FIG. 1 is completed. In the coating process, the coating substance flowing out on the upper surface of the first storage unit 140 forms pads 155a, 155b, 165a, 165b, 175a, and 175b.

Meanwhile, the coating process is a back contact coating process, but the damascene coating process can be used for the coating process. In the damascene coating process, negative electricity is applied to the seed layers 152a, 152b, 162a, 162b, 172a, and 172b through the upper surface of the fourth wafer 140 so that positive metal ions are coated. For facilitation of the damascene coating process, the seed layers 152a, 152b, 162a, 162b, 172a, and 172b may be stacked up to a certain portion of the upper surface of the fourth wafer 140.

However, in the back contact coating process, the rear sides of the wafers 110 to 140 are used for application of the negative electricity to the seed layers 152a, 152b, 162a, 162b, 172a, and 172b, so that positive metal ions are coated.

Figure 3:
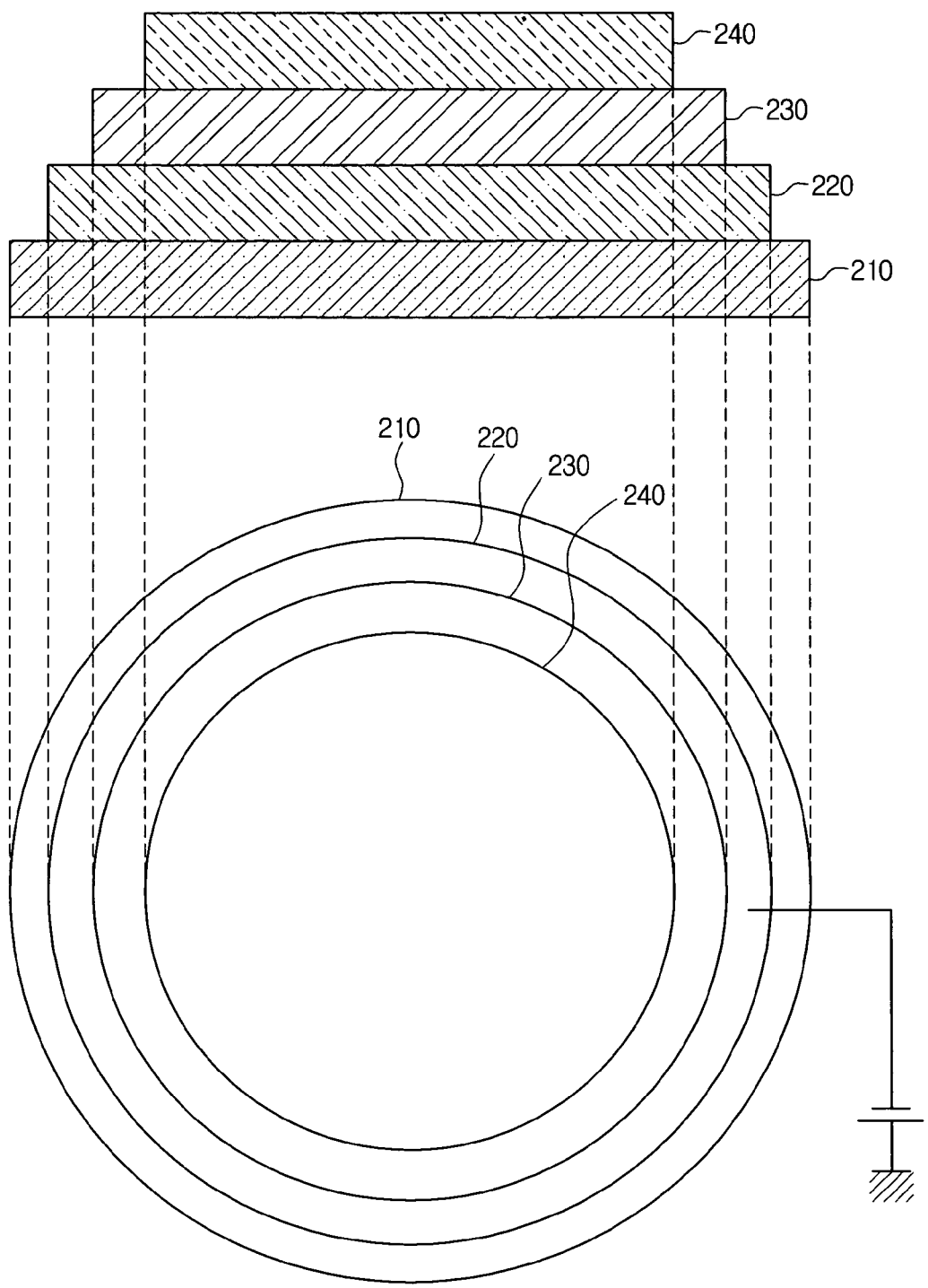
FIG. 3 is a vertical cross-sectional view for showing a wafer-stacking structure for coating in a back contact process.

FIG. 3 is a vertical cross-sectional view for showing a wafer stack structure, prior to dicing, enabling the back contact coating process to facilitate. In FIG. 3, plural wafers 210, 220, 230 and 240 each having a different diameter are used. Here, the centers of the individual wafers are arranged to be in a coaxial line are bonded. Next, the via holes are formed to connect the individual wafers and the coating process is performed.

For the coating process, negative electricity is applied to the exposure areas located on the edges of the individual wafers 210 to 240. That is, since the wafers 210 to 240 each have a different diameter, the edges of the wafers 210 to 230 except the uppermost wafer 240 are partially exposed. Thus, the back contact coating process can be easily performed through the exposed areas.

As described above, the exemplary embodiment of the present invention bonds plural wafers one another, forms via holes, and performs the coating process. Thus, the exemplary embodiment of the present invention can form interconnection electrodes directly connecting up to circuit devices mounted on the individual wafers. As a result, the exemplary embodiment of the present invention can reduce the number of via hole-forming processes, improving fabrication yield. Further, since there is no need to connect the interconnection electrodes by means of ball bumps or the like, the exemplary embodiment of the present invention can prevent performance degradation due to the high-resistance value of the ball bumps, poor contact between the ball bumps and the interconnection electrodes, disconnections, arrangement error, and so on. Accordingly, the exemplary embodiment of the present invention can improve the performance and reliability of a packaging chip.

Further, the foregoing exemplary embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A packaging chip, comprising:
    plural wafers which are stacked; and
    plural first and second interconnection electrodes directly connecting the plural wafers from an upper surface of an uppermost wafer of the plural wafers to the other wafers;
    wherein each interconnection electrode extends directly from the upper surface of the uppermost wafer to the upper surfaces of the different wafers, respectively, and a first plurality of interconnection electrodes do not penetrate through the wafer to which they are connected, and a second plurality of interconnection electrodes penetrate through the wafer to which they are connected.

2. The packaging chip as claimed in claim 1, wherein at least one or more wafers of the plural wafers have a cavity of a predetermined size.

3. The packaging chip as claimed in claim 1, wherein at least one or more of the plural wafers has a predetermined circuit device mounted thereon.

4. The packaging chip as claimed in claim 1, further comprising plural pads independently arranged on the upper surface of the uppermost wafer, each of the plural pads is electrically connected to at least one of the plural interconnection electrodes.

5. The packaging chip as claimed in claim 1, wherein the plural wafers are stacked in a predetermined order.

6. The packaging chip as claimed in claim 1, wherein the wafers each have a different diameter, and
    wherein the wafers are arranged in a coaxial line in order of diameter size, such that a predetermined area of each of the plural wafers is externally exposed.

* * * * *